United States Patent
Tsukahara

(10) Patent No.: US 6,534,725 B2
(45) Date of Patent: Mar. 18, 2003

(54) HIGH-FREQUENCY CIRCUIT BOARD AND SEMICONDUCTOR DEVICE USING THE HIGH-FREQUENCY CIRCUIT BOARD

(75) Inventor: Yoshihiro Tsukahara, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/873,191

(22) Filed: Jun. 5, 2001

(65) Prior Publication Data

US 2002/0141168 A1 Oct. 3, 2002

(30) Foreign Application Priority Data

Feb. 23, 2001 (JP) ........................................ 2001-048233

(51) Int. Cl.⁷ .......................... H05K 7/06; H01L 23/48; H01P 1/15
(52) U.S. Cl. ...................... 174/260; 174/261; 361/777; 361/783; 257/664; 257/728; 257/778; 333/247
(58) Field of Search ................................. 361/777, 780, 361/783, 794; 333/12, 238, 246, 247; 257/664, 728, 778; 174/260–262, 250

(56) References Cited

U.S. PATENT DOCUMENTS

| 4,045,750 | A | * | 8/1977 | Marshall | 174/117 A |
| 4,615,604 | A | * | 10/1986 | Yamada | 174/260 |
| 5,006,820 | A | * | 4/1991 | Prioste et al. | 333/246 |
| 5,942,957 | A | * | 8/1999 | Mohwinkel et al. | 333/128 |
| 6,320,476 | B1 | * | 11/2001 | Tsukahara | 333/104 |

FOREIGN PATENT DOCUMENTS

| JP | 11-225019 A | * | 8/1999 |
| JP | 2000-165101 | | 6/2000 |

OTHER PUBLICATIONS

U.S. patent application Ser. No. 09/416,525, Tsukahara, filed Oct. 12, 1999.

* cited by examiner

Primary Examiner—Albert W. Paladini
Assistant Examiner—John B. Vigushin
(74) Attorney, Agent, or Firm—Leydig, Voit & Mayer, Ltd.

(57) ABSTRACT

A high-frequency switch includes: a high-frequency circuit board including an MIC substrate, a microstrip line disposed on a front surface of the MIC substrate, and a signal wiring layer and a front surface grounding conductor disposed along the microstrip line; bumps disposed on the microstrip line, the signal wiring layer, and the front surface grounding conductor; and a semiconductor chip disposed on the high-frequency circuit board through the bumps. A gate electrode of a transistor of the semiconductor chip is connected to the signal wiring layer of the high-frequency circuit board through at least one of the bumps; a source electrode is connected to the front surface grounding conductor through at least one of the bumps; and a drain electrode is connected to the microstrip line through at least one of the bumps.

6 Claims, 11 Drawing Sheets

HIGH-FREQUENCY CIRCUIT BOARD AND SEMICONDUCTOR DEVICE USING THE HIGH-FREQUENCY CIRCUIT BOARD

BACKGROUND OF THE INVENTION

1. Field of the Invention

The present invention relates to a high-frequency circuit board used for transmission/reception in a high-frequency band, particularly the millimeter-wave band, and also to a semiconductor device using the high-frequency circuit board.

2. Background Art

One known switch for switching signals is employed in 15 transmission equipment, reception equipment, and transmission/reception modules used for radar or for communications in the microwave or millimeter-wave band.

FIG. 15 is a plan view of a conventional switch MMIC (Monolithic Microwave IC) chip, and FIG. 16 is a circuit diagram showing an equivalent circuit of the switch.

Referring to FIG. 15, reference numeral 100 denotes a switch MMIC chip; 102 a GaAs substrate; 104 an FET; 104a a source electrode; 104b a drain electrode; 104c a gate electrode; 104d an air-bridge wire interconnecting source electrodes 104a; 106 an input terminal; 108 an input line; 110 an air-bridge wire bridging between the input line 108 and each drain electrode 104b; 112 an output line; 114 a connection line connecting between the output line 112 and each drain electrode 104b; 116 an output terminal; and 118 a via hole connected to each source electrode 104a and to a grounding conductor disposed on the back surface of the GaAs substrate 102.

Furthermore, in the figure, reference numeral 120 denotes a gate signal input terminal, and 122 denotes a control signal line connected to each gate electrode 104c. Reference numeral 124 indicates a capacitor having a first end connected to the control signal line 122 and a second end connected to a via hole 126, which is further connected to the grounding conductor disposed on the back surface of the GaAs substrate 102. Reference numeral 128 denotes a resistor.

In FIG. 16, the input line 108 and the output line 112 each have a characteristic impedance of 50 Ω. The switch 100 supplies an ON/OFF signal from the gate signal input terminal to each gate electrode 104c to pass or cut off a high-frequency signal applied to the input terminal 106. When the high-frequency signal is passed from the input terminal 106 to the output terminal 116, the FET 104 is in the OFF-state, and therefore can be regarded as a capacitor having the off-capacitance of the FET. This means that the high-frequency signal is output to the output terminal 116 through a filter composed of the inductance components of the input line 108 and the output line 112 and the off-capacitance of the FET 104.

In the conventional switch 100 having a configuration as described above, the FET 104 formed on the GaAs substrate 102 is composed of a plurality of FET devices. Accordingly, the value of the off-capacitance of the FET 104 may vary when not all of the FET devices have identical electrical characteristics, which occurs depending on position of the wafer on which the switch 100 is formed or which is caused by process variations.

Especially, when the conventional switch MMIC was applied to a millimeter-wave band, a variation in the off-capacitance affected the filter characteristics and, as a result, the frequency characteristics of the switch varied, reducing the yield of the switch in some cases.

SUMMARY OF THE INVENTION

In order to solve the above problems, it is a first object of the present invention to provide an inexpensive high-frequency circuit board used for switches having good high-frequency characteristics. A second object of the present invention is to provide an inexpensive and highly reliable semiconductor device using such a high-frequency circuit board.

According to one aspect of the present invention, a high-frequency circuit board comprises a dielectric substrate, and a high-frequency signal line is mounted on a main surface of said dielectric substrate and has an input end and an output end for high-frequency signals. Another signal line is disposed on said main surface along said high-frequency signal line, and a first grounding conductor is disposed on said main surface along said high-frequency signal line.

In another aspect, in the high-frequency circuit, said high-frequency signal line may have a plurality of branch portions along which said first grounding conductor and said another signal line are disposed.

In another aspect, the high-frequency circuit may further comprise a second grounding conductor. The first grounding conductor is disposed on one side of said high-frequency signal line with said another signal line between said first grounding conductor and said high-frequency signal line, and said second grounding conductor is preferably disposed along said high-frequency signal line on the other side of said high-frequency signal line.

According to another aspect of the present invention, a semiconductor device comprises a high-frequency circuit board as described above and a plurality of bumps disposed on said high-frequency signal line, said another signal line, and said first grounding conductor of said high-frequency circuit board. Further, a semiconductor chip is disposed on said high-frequency circuit board. The semiconductor chip includes a semiconductor substrate and a transistor disposed on said semiconductor substrate, and the transistor has a control electrode, a first electrode, and a second electrode, wherein said control electrode is connected to said another signal line through one of said plurality of bumps, said first electrode is connected to said first grounding conductor through one of said plurality of bumps, and said second electrode is connected to said high-frequency signal line through one of said plurality of bumps.

Other and further objects, features and advantages of the invention will appear more fully from the following description.

BRIEF DESCRIPTION OF THE DRAWINGS

FIG. 7 is a circuit diagram showing an equivalent circuit of the high-frequency switch of the first embodiment when the high-frequency signal is passed through;

DETAILED DESCRIPTION OF PREFERRED EMBODIMENTS

First Embodiment

Figure 1:
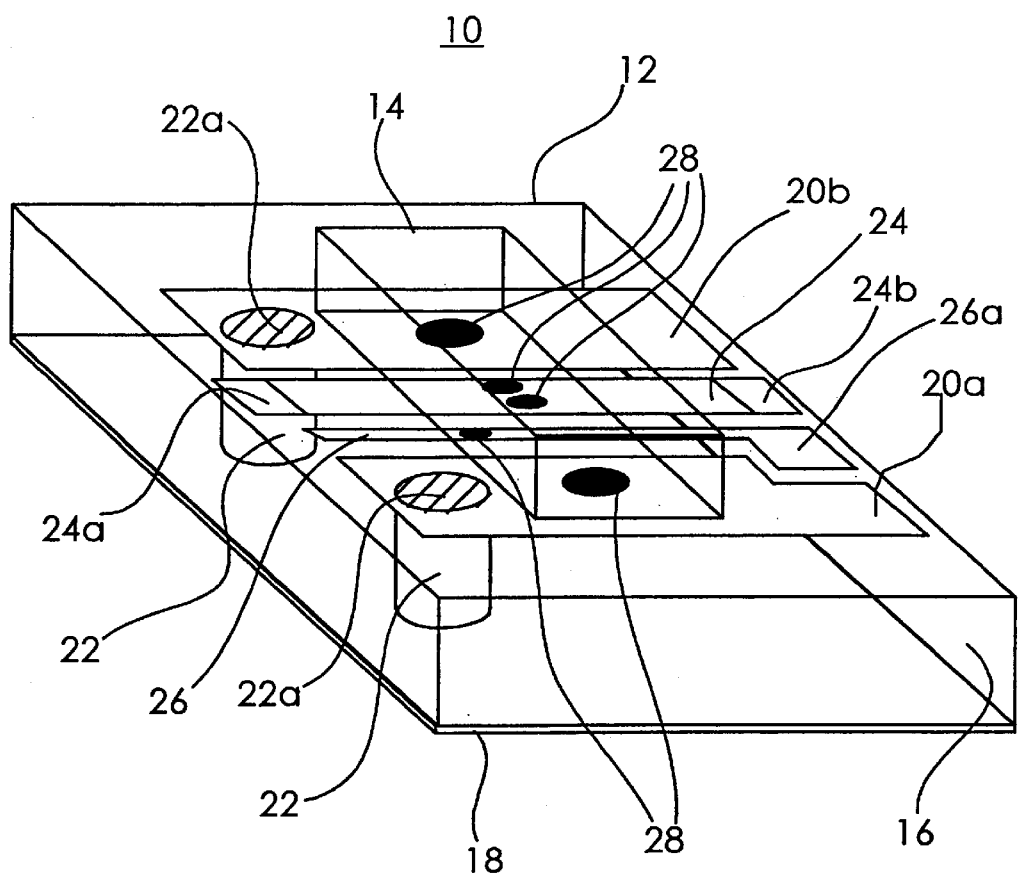
FIG. 1 is a perspective oblique view of portions of a high-frequency switch according to a first embodiment of the present invention.
Figure 2:
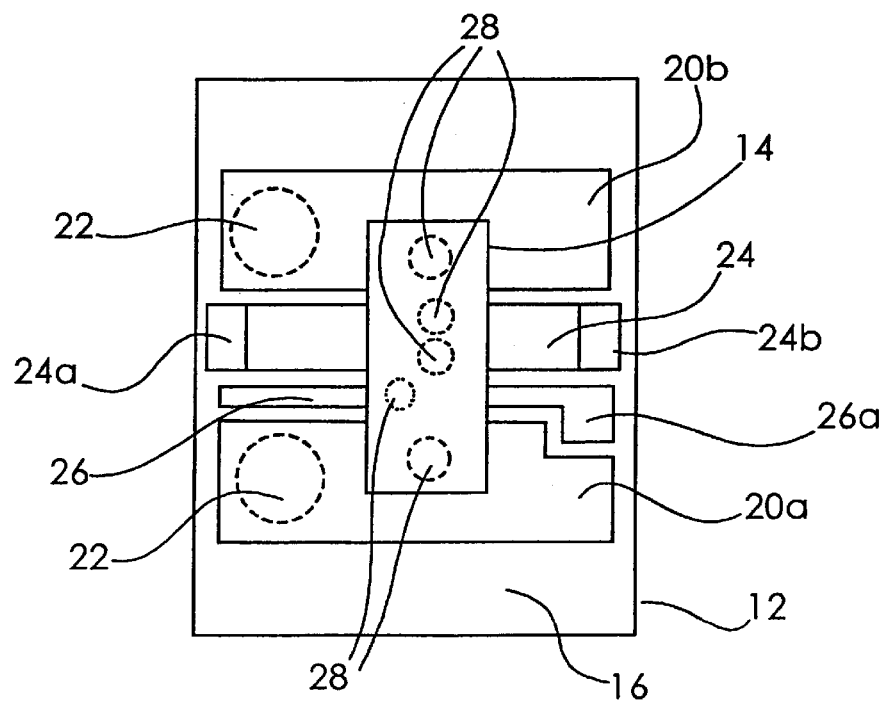
FIG. 2 is a plan view of the high-frequency switch according to the first embodiment of the present invention.

FIG. 1 is a perspective oblique view of portions of a high-frequency switch according to a first embodiment of the present invention. FIG. 2 is a plan view of this high-frequency switch.

Referring to FIGS. 1 and 2, reference numeral 10 denotes a high-frequency switch, 12 denotes a high-frequency circuit board constituting the high-frequency switch 10, and 14 denotes a semiconductor chip, specifically an FET chip. Reference numeral 16 denotes a dielectric substrate, specifically an MIC substrate composed of alumina and glass epoxy for example, and 18 denotes a back surface grounding conductor formed on the back surface of the MIC substrate 16 by Au plating for example. Reference numeral 20 indicates a front surface grounding conductor disposed on the front surface of the MIC substrate 16. The front surface grounding conductor 20 includes a front surface grounding conductor (I) 20a and a front surface grounding (II) 20b as its first and second grounding conductors, respectively.

Reference numeral 22 denotes a via hole which electrically connects both the front surface grounding conductor (I) 20a and the front surface grounding conductor (II) 20b to the back surface grounding conductor 18. Reference numeral 22a indicates the connection surface of the via hole 22 and the front surface grounding conductor 20 schematically shown in the figure. Reference numeral 24 denotes a microstrip line as a high-frequency signal line. Reference numeral 24a indicates the input end of the microstrip line 24, while 24b indicates the output end of the microstrip line 24. In the above configuration, the microstrip line 24 is used as a high-frequency signal line. However, a coplaner line may be used as the high-frequency signal line instead.

Reference numeral 26 denotes a signal wiring layer acting as a signal line, and 26a denotes its input end to which a control signal voltage is applied. The front surface grounding conductor 20, microstrip line 24, and signal wiring layer 26 are each formed by Au plating, etc. Reference numeral 28 indicates a bump schematically shown in the figure.

It should be noted that even though a capacitor and a resistor are disposed and connected to the signal wiring layer 26, they are not shown in FIGS. 1 and 2.

The signal wiring layer 26 is disposed on one side of the microstrip line 24 on the high-frequency circuit board 12 so that the signal wiring layer 26 is adjacent to and along the microstrip line 24. Furthermore, the front surface grounding conductor (I) 20a is disposed on the same side as the signal wiring layer 26 so that the front surface grounding conductor (I) 20a is along the microstrip line 24 and the signal wiring layer 26 at a position a little farther from the microstrip line 24 than the signal wiring layer line 26 is. In addition, the front surface grounding conductor (II) 20b is arranged to be adjacent to and along the microstrip line 24 on the other side of the microstrip line 24.

That is, the signal wiring layer 26 and the front surface grounding conductor (I) 20a are disposed along the microstrip line 24 on one side of the microstrip line 24, while the front surface grounding conductor (II) 20b is disposed along the microstrip line 24 on the other side of the microstrip line 24.

Figure 3:
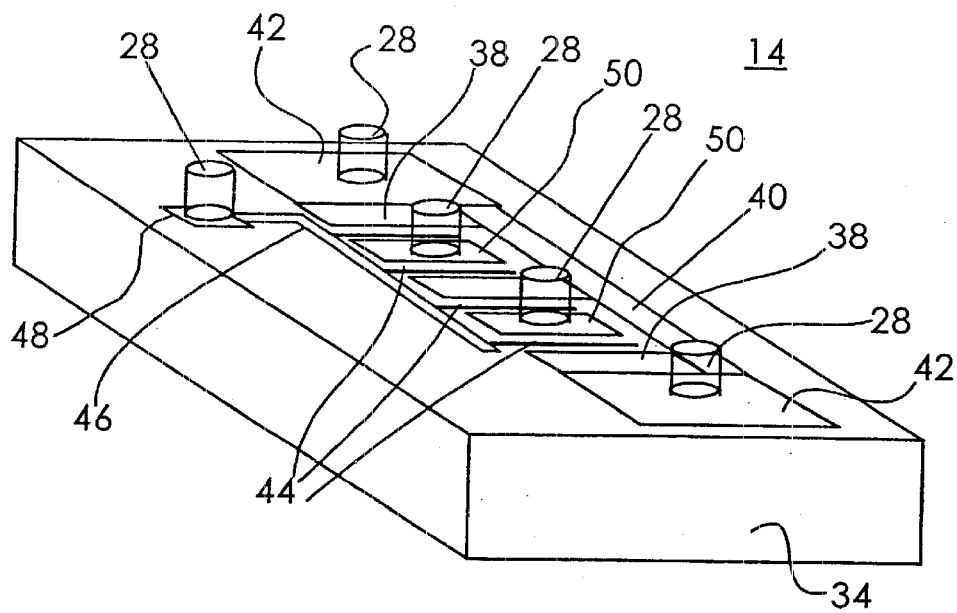
FIG. 3 is a perspective oblique view of portions of a semiconductor chip constituting the high-frequency switch according to the first embodiment of the present invention.
Figure 4:
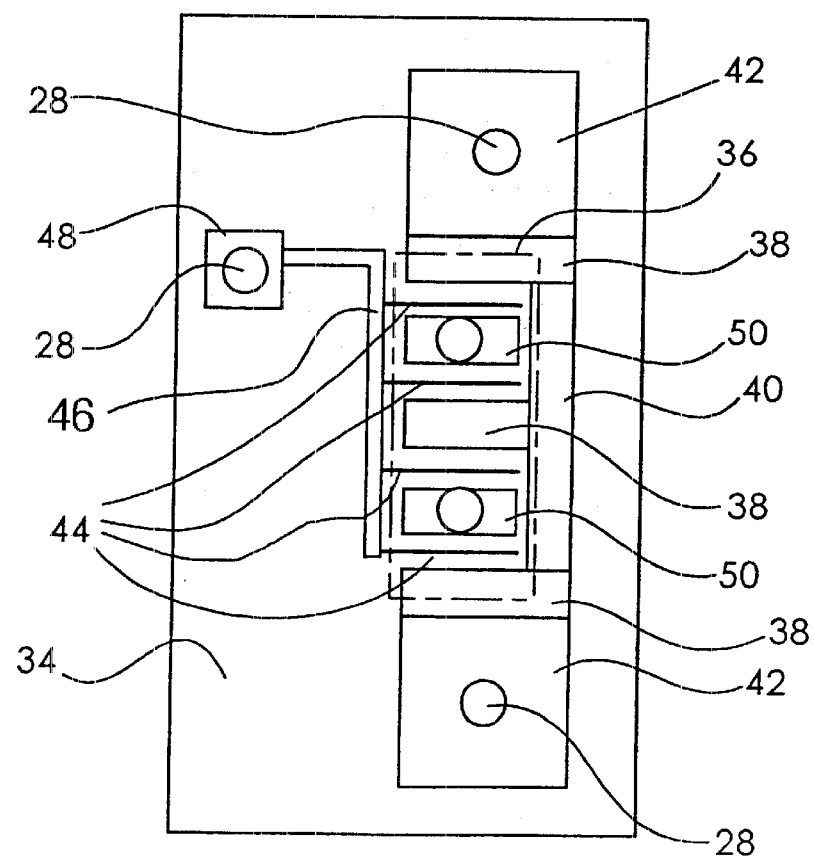
FIG. 4 is a plan view of the semiconductor chip constituting the high-frequency switch according to the first embodiment of the present invention.

FIG. 3 is a perspective oblique view of portions of a semiconductor chip constituting a high-frequency switch according to the first embodiment of the present invention. FIG. 4 is a plan view of this semiconductor chip.

Referring to FIGS. 3 and 4, reference numeral 34 denotes a semi-insulating GaAs substrate, on which an FET 36 and its electrodes are formed. The FET 36 is composed of a plurality of FET devices connected in parallel.

Reference numeral 38 denotes a source electrode as a first electrode of the FET 36. There are three source electrodes 38 disposed, one at both ends and one in the middle, connected to one another by a source-drawing electrode 40. Furthermore, a source pad 42 is disposed next to each source electrode 38 at both ends. The source pads 42 each have a bump 28 thereon, and the source electrodes 38, the source pads 42, and the bumps 28 are electrically connected to one another.

In the above configuration, a source electrode 38 is disposed at both ends, and each source electrode 38 is connected to the front surface grounding conductor (I) 20a and the front surface grounding conductor (II) 20b through the bumps 28 on the source pads 42. This arrangement is adopted to reduce the parasitic inductance and enhance the isolation.

Reference numeral 44 denotes a gate electrode as a control electrode. Each gate electrode 44 is connected to a gate-drawing electrode 46, which is further connected to a gate pad 48. A bump 28 is disposed on the gate pad 48. Reference numeral 50 denotes a drain electrode as a second electrode of the FET 36. Each drain electrode 50 is disposed next to a gate electrode 44 along the source electrodes 38. Each drain electrode 50 also has a bump 28 disposed thereon.

In the high-frequency switch 10 shown in FIG. 1, the FET chip 14 is disposed on the high-frequency circuit board 12 through bumps 28. Therefore, the front surface grounding conductor (I) 20a and the front surface grounding conductor (II) 20b are connected to the source electrode 38 through a bump 28. Likewise, the microstrip line 24 and the signal wiring layer 26 are connected to the drain electrodes 50 and the gate electrodes 44 through bumps 28, respectively.

Furthermore, since the signal wiring layer 26 and the front surface grounding conductor (I) 20a are disposed along the microstrip line 24 on one side of the microstrip line 24 while the front surface grounding conductor (II) 20b is disposed on the other side along the microstrip line 24, the connection position of the FET chip 14 disposed through bumps 28 can be adjusted along the microstrip line 24.

Figure 5:
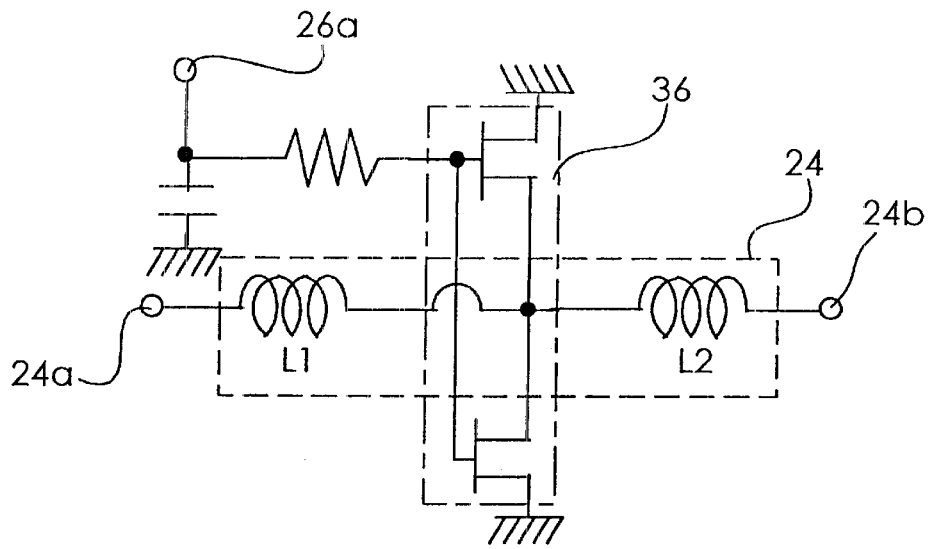
FIG. 5 is a circuit diagram showing an equivalent circuit of the high-frequency switch according to the first embodiment of the present invention.

FIG. 5 is a circuit diagram showing an equivalent circuit of the high-frequency switch according to the first embodiment.

In the figure, the equivalent inductance of the input side of the microstrip line 24 is denoted by L1, while the equivalent inductance of the output side of the microstrip line 24 is denoted by L2 (the input side means the portion of the microstrip line 24 before the position at which the FET chip 14 is connected to the drain electrodes 50 through the bumps 28, and the output side means the portion of the microstrip line 24 after the connection position).

Next, description will be made of the operation of the high-frequency switch 10.

Figure 6:
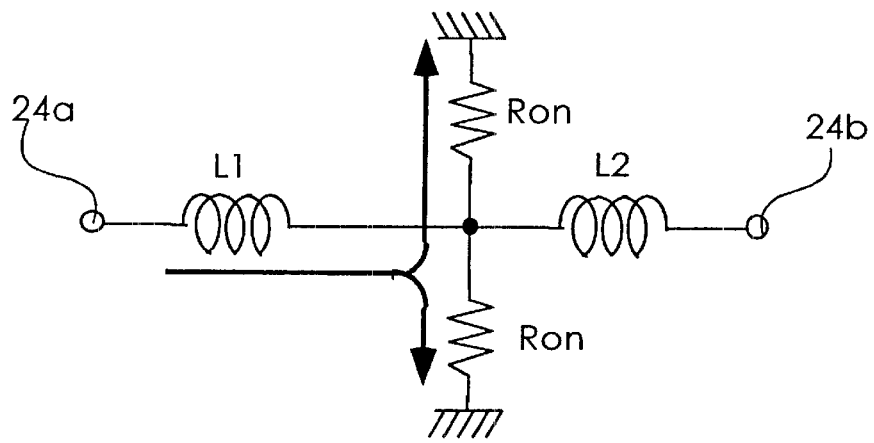
FIG. 6 is a circuit diagram showing an equivalent circuit of the high-frequency switch of the first embodiment when the high-frequency signal is cut off.
Figure 7:
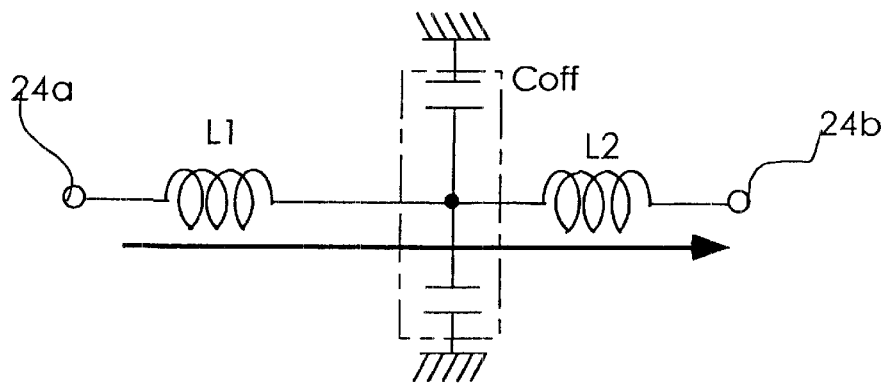

FIG. 6 is a circuit diagram showing an equivalent circuit of the high-frequency switch 10 when the high-frequency signal is cut off, while FIG. 7 is a circuit diagram showing an equivalent circuit of the high-frequency switch 10 when the high-frequency signal is passed through.

In FIG. 5, when a gate control voltage Vg applied to the input end 26a for receiving a control signal voltage is so set that Vg=0, the source-drain of the FET 36 can be regarded as being in the ON-state having an on-resistance of Ron.

At that time, if the on-resistance Ron of the FET 36 is a few ohms or so, the equivalent circuit of FIG. 5 further becomes equivalent to that of FIG. 6. Since a high-frequency signal entered from the input end 24a of the microstrip line 24 is passed through the on-resistance of the FET 36 to the ground, the high-frequency signal is not output to the output end 24b, that is, the signal is cut off.

When a gate control voltage Vg applied to the input end 26a for receiving a control signal voltage is so set that Vg<<Vp, where Vp indicates a gate cutoff voltage (pinch-off voltage), the source-drain of the FET 36 can be regarded as being in the OFF-state having an off-capacitance of Coff. At that time, the equivalent circuit of FIG. 5 further becomes equivalent to that of FIG. 7. The high-frequency signal entered from the input end 24a of the microstrip line 24 is passed through a filter made up of the inductance components L1 and L2 of the microstrip line 24 and the off-capacitance Coff to the output end 24b.

The value of the off-capacitance Coff of the FET 36 may vary since the FET chip 14 is composed of a plurality of FET devices and not all of the FET devices may have identical electrical characteristics, which occurs depending on the position of the wafer on which the FET chip 14 is formed or which is caused by process variations.

In this high-frequency switch 10, however, the connection position of the FET chip 14 disposed through bumps 28 can be adjusted by moving the connection position along the microstrip line 24 as described above. This arrangement makes it possible to adjust the characteristics of the filter made up of the inductance components L1 and L2 of the microstrip line 24 and the off-capacitance Coff, thereby reducing the variation in the frequency characteristics due to a variation in the value of Coff.

When the high-frequency switch 10 is on, the cutoff frequency f1 is expressed by the following formula.

$$f1 = 1/(2\pi(L1 \times Coff)^{1/2}) \qquad (1)$$

When the off-capacitance is changed from Coff to Coffm, the cutoff frequency varies from f1 to f1m as expressed by the following formula.

$$f1m = 1/(2\pi(L1 \times Coffm)^{1/2}) \qquad (2)$$

In order to correct the variation, it is necessary to obtain L1m by the following equation.

$$L1 \times Coff = L1m \times Coffm \qquad (3)$$

The above equation is arranged to correct L1 as follows.

$$L1m = (Coff/Coffm) \times L1 \qquad (4)$$

Accordingly, the connection position of the FET chip 14 is moved along the microstrip line 24 to adjust the values of the inductance components.

Thus, by adjusting the values of the inductance components, it is possible to adjust the frequency characteristics, thereby increasing the yield of the high-frequency switch 10. As a result, highly-reliable high-frequency switches having identical frequency characteristics can be obtained.

Furthermore, an expensive GaAs substrate must be used for only the FET chip 14, and an MIC substrate made of alumina, etc. can be used for the high-frequency circuit board 12, resulting in a low-cost configuration.

Second Embodiment

Figure 8:
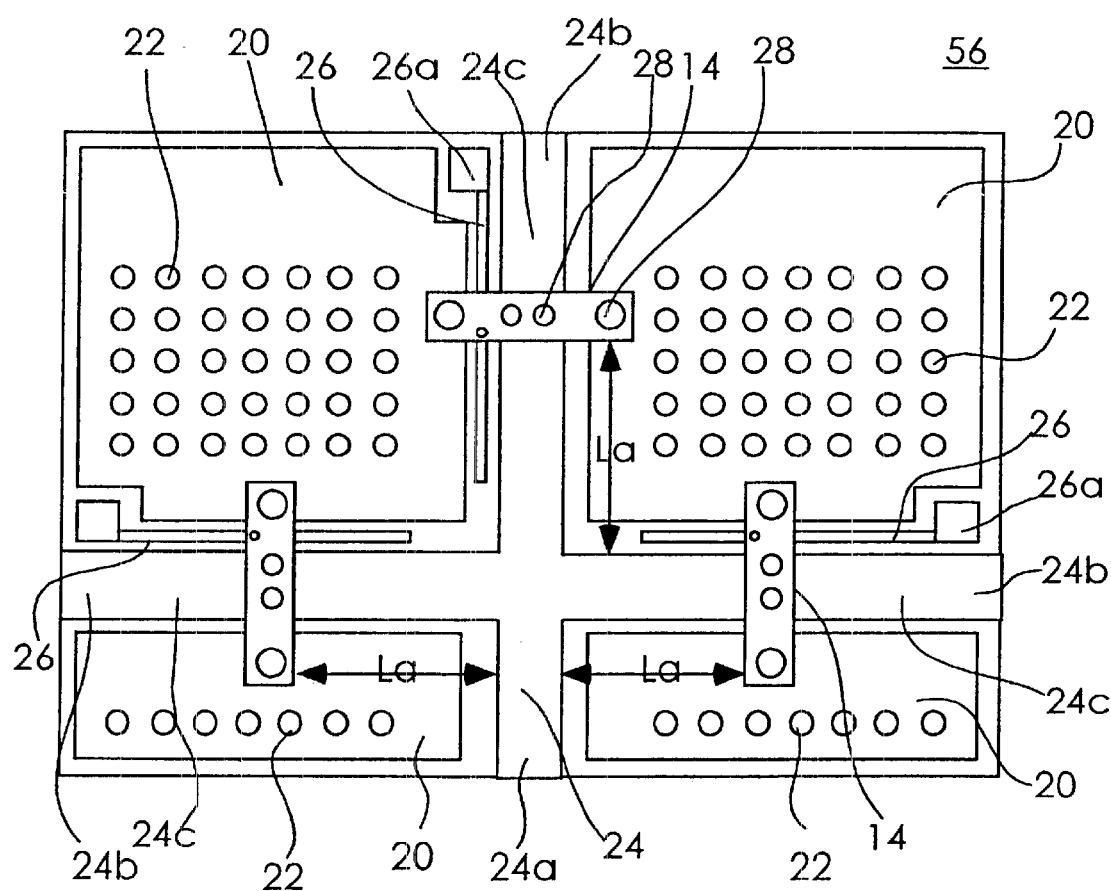
FIG. 8 is a plan view of a branching switch according to a second embodiment of the present invention.
Figure 9:
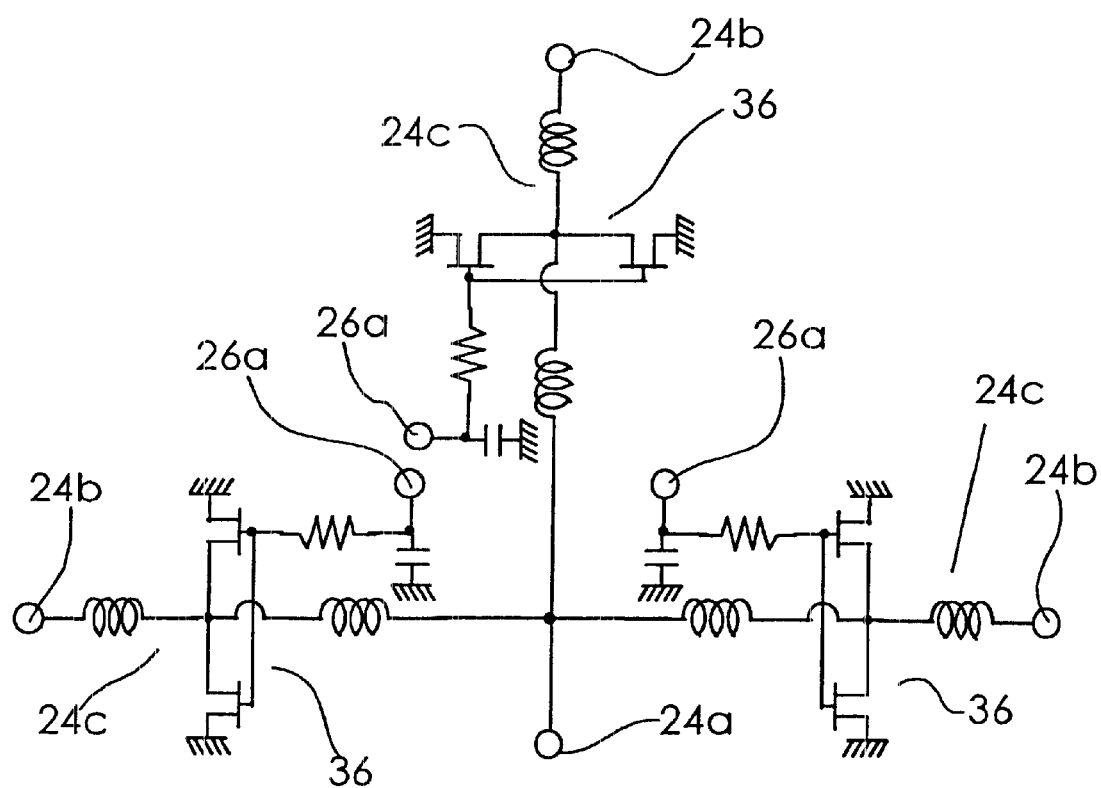
FIG. 9 is a diagram showing an equivalent circuit of the branching switch according to the second embodiment of the present invention.

FIG. 8 is a plan view of a branching switch according to the second embodiment of the present invention, and FIG. 9 is a circuit diagram showing an equivalent circuit of this branching switch. Components in FIGS. 8 and 9 and in the following description which are the same as or correspond to those of the first embodiment are denoted by like numerals.

In FIG. 8, reference numeral 56 denotes a branching switch, for example, an SP3T (Single Pole 3 Throw) switch. In the SP3T switch 56, a microstrip line 24 has 3 branch portions 24c. As in the high-frequency switch 10 of the first embodiment, in each branch portion 24c, a signal wiring layer 26 and a front surface grounding conductor (I) 20a are disposed along the microstrip line 24 on one side of the microstrip line 24, while the front surface grounding conductor (II) 20b is disposed on the other side along the microstrip line 24.

That is, each branch portion 24c constitutes the high-frequency switch 10 of the first embodiment.

Accordingly, a high-frequency signal supplied to an input end 24a of the microstrip line 24 is selectively output from an output end 24b provided on a branch portion 24c under control of a control signal applied to a gate electrode 44 of each FET chip 14.

Also in the case of each FET chip 14 used in this SP3T switch 56, the value of the off-capacitance Coff of the FET 36 may vary since the FET chip 14 is composed of a plurality of FET devices and not all of the FET devices may have identical electrical characteristics, which occurs depending on the position of the wafer on which the FET chip 14 is formed or which is caused by process variations.

In this SP3T switch 56, however, the connection position La (measured from the branch point) of each FET chip 14 disposed through bumps 28 can be moved along the respective branch portion 24c of the microstrip line 24. By changing the connection position La so as to adjust the inductance components of the microstrip line 24, it is possible to adjust the characteristics of the filter made up of an inductance component L1 and the value of the off-capacitance Coff, thereby reducing the variation in the frequency characteristics due to a variation in the value of the off-capacitance of the FET 36.

In particular, in the branching switch, it is necessary to make the frequency characteristics of all branch portions 24c of the microstrip line 24 identical. Therefore, by reducing the variation in the frequency characteristics due to a variation in the value of the off-capacitance of the FET 36, it is possible to provide an inexpensive and highly reliable branch switch whose product yield is higher than that of the high-frequency switch 10 of the first embodiment.

Furthermore, a desired frequency band to be used can be changed by appropriately selecting each connection position La.

Figure 10:
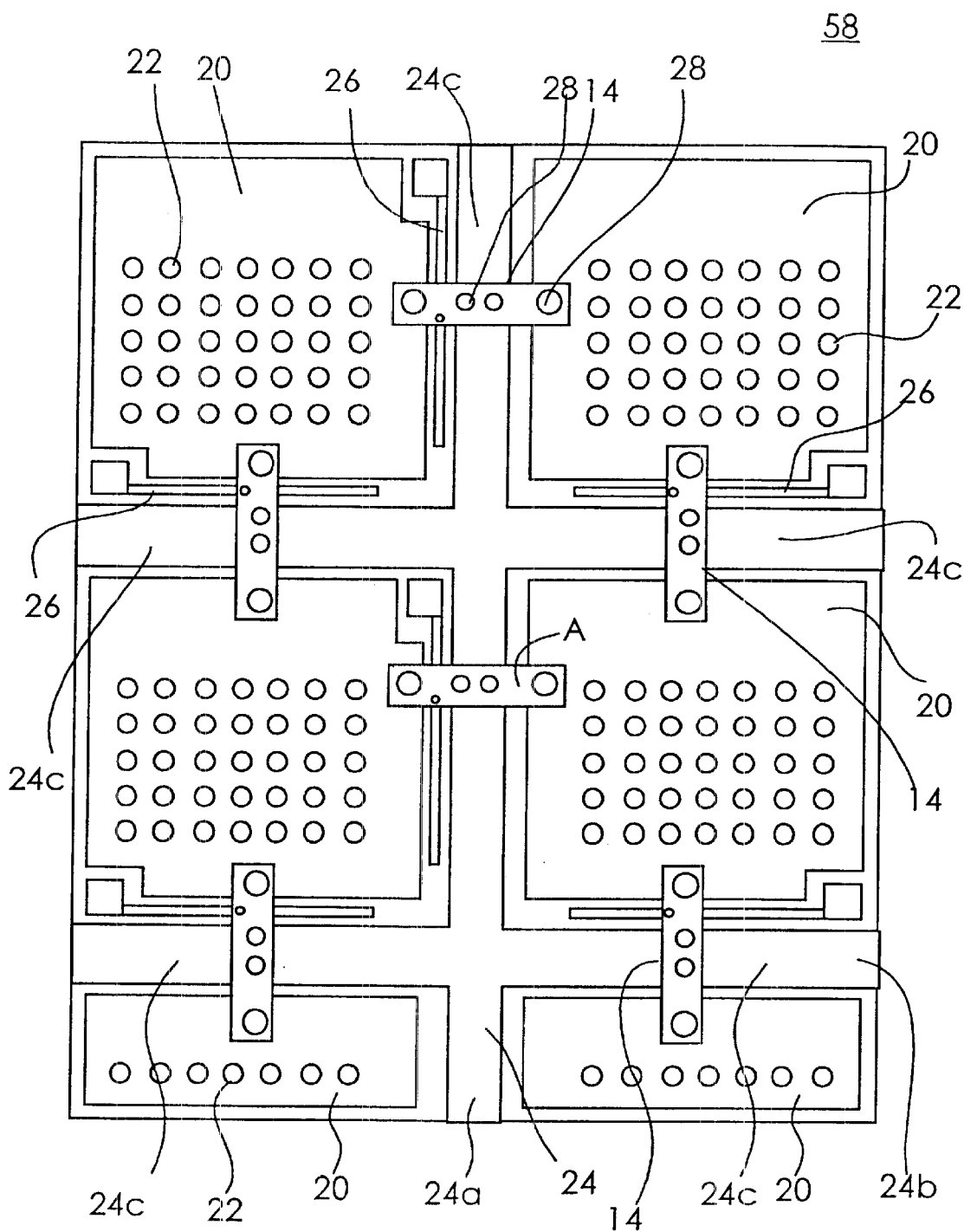
FIG. 10 is a plan view of another branching switch according to the second embodiment of the present invention.

FIG. 10 is a plan view of another branching switch according to the second embodiment.

In the figure, reference numeral 58 denotes an SP5T comprising an increased number of the branch portions 24c of the microstrip line 24. An FET chip 14 indicated by reference numeral A can be omitted.

Each branch portion 24c of this SP5T 58 can be divided to produce a plurality of branch portions 24c thereby increasing the total number of branch portions 24c. This way, it is possible to produce an SPnT.

Third Embodiment

Figure 11:
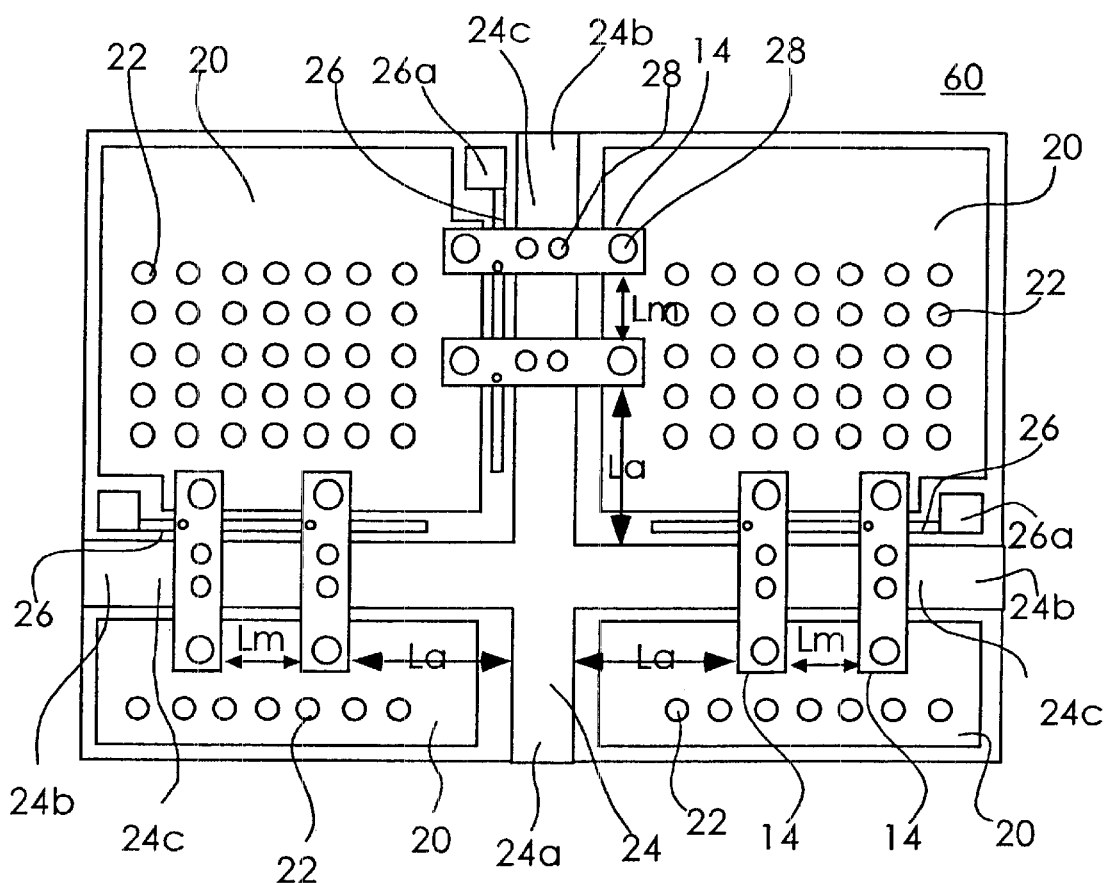
FIG. 11 is a plan view of a branching switch according to a third embodiment of the present invention.

FIG. 11 is a plan view of a branching switch according to a third embodiment of the present invention.

In the figure, reference numeral 60 denotes an SP3T switch. The SP3T switch 60 is produced by adding another FET chip 14 to the FET chip 14 of each branch portion 24c of the microstrip line 24 in the SP3T switch 56 of the second embodiment, the another FET chip 14 being Lm away from the respective FET chip 14. Since the same control signal is applied to the gate electrodes 44 of the two FET chips 14 of each branch portion 24c, the corresponding two FETs 36 are turned ON or OFF at the same time.

Table 1 shows the values of the connection positions La and Lm of the FET chips 14 in the SP3T switch 60 for a 60-GHz band, a 77-GHz band, and a 90-GHz band, respectively. The high-frequency circuit board 12 used to prepare Table 1 has a relative permittivity Er of 9.8 and a thickness t of 200 µm.

TABLE 1

|  | La (mm) | Lm (mm) |
| --- | --- | --- |
| 77 GHz | 1.75 | 0.17 |
| 60 GHz | 2.35 | 0.29 |
| 90 GHz | 1.40 | 0.10 |

Substrate material: Al$_2$O$_3$
Er = 9.8
t = 200 µm

Figure 12:
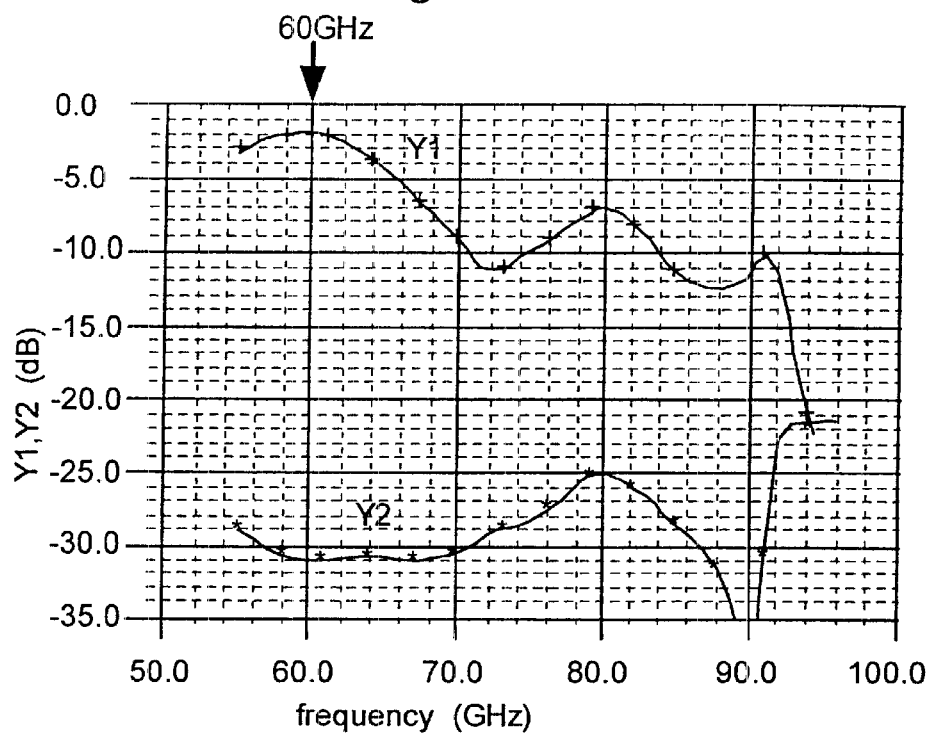
FIG. 12 is a graph showing the loss and the isolation of a branching switch according to the third embodiment of the present invention.
Figure 13:
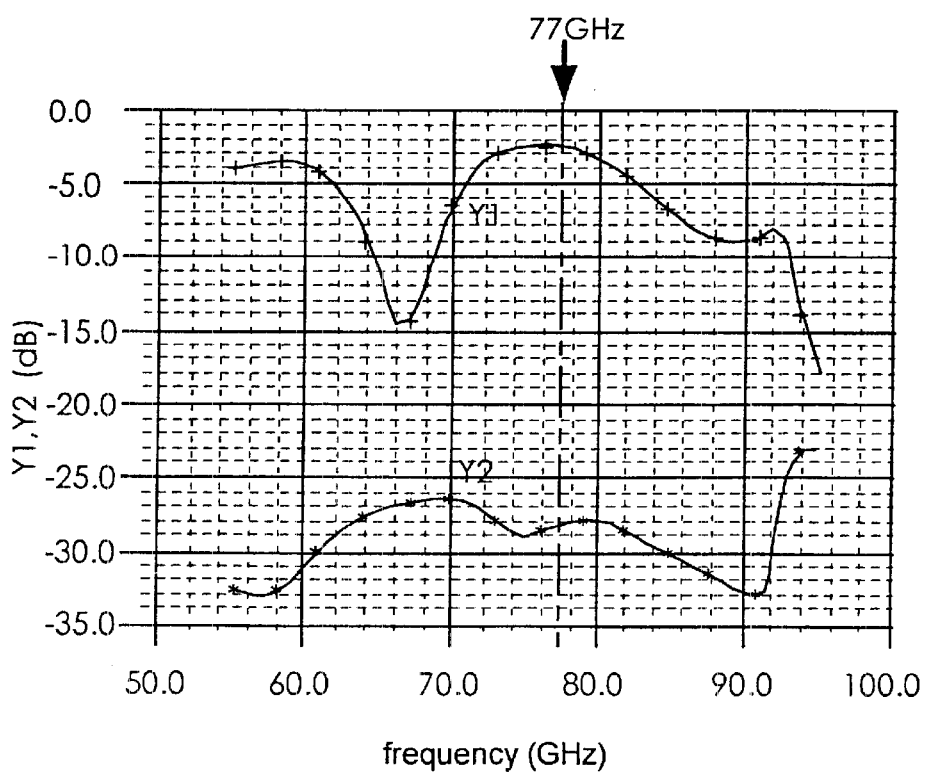
FIG. 13 is a graph showing the loss and the isolation of a branching switch according to the third embodiment of the present invention.
Figure 14:
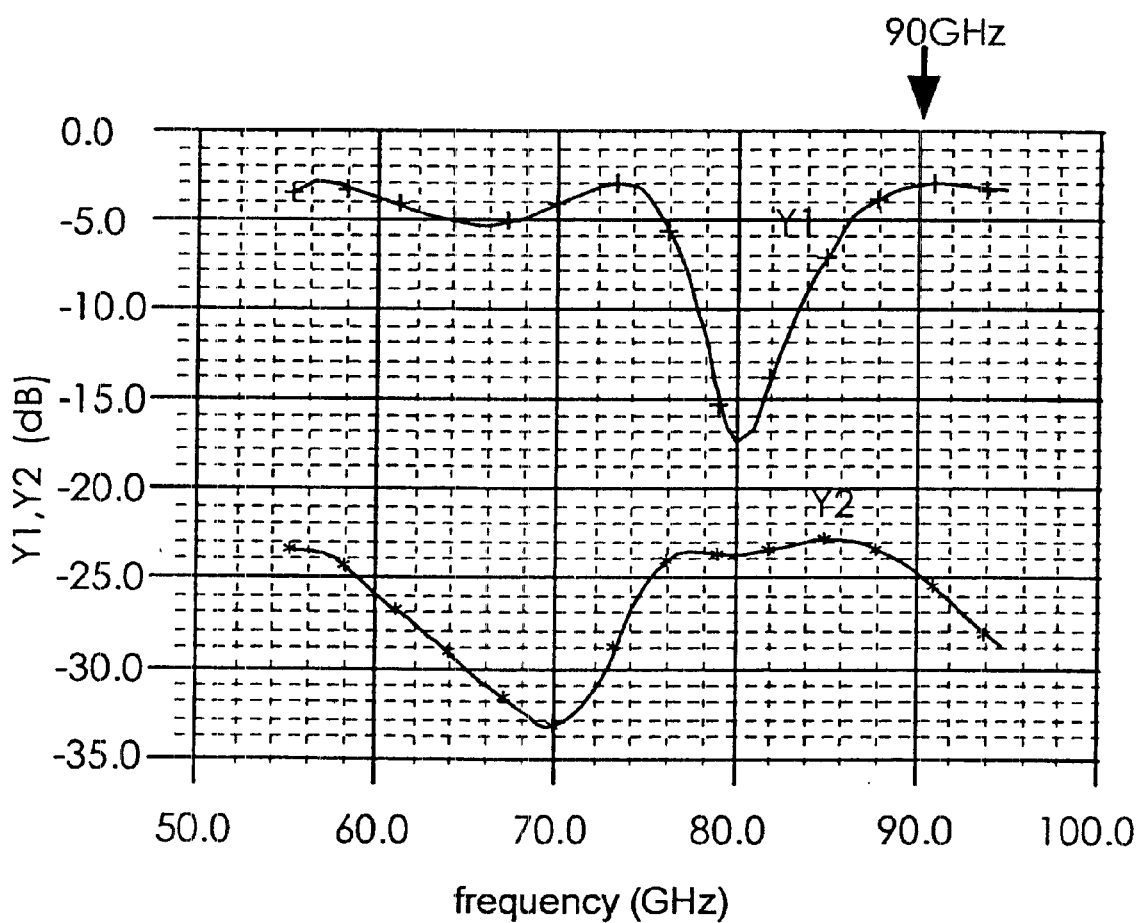
FIG. 14 is a graph showing the loss and the isolation of a branching switch according to the third embodiment of the present invention.
Figure 15:
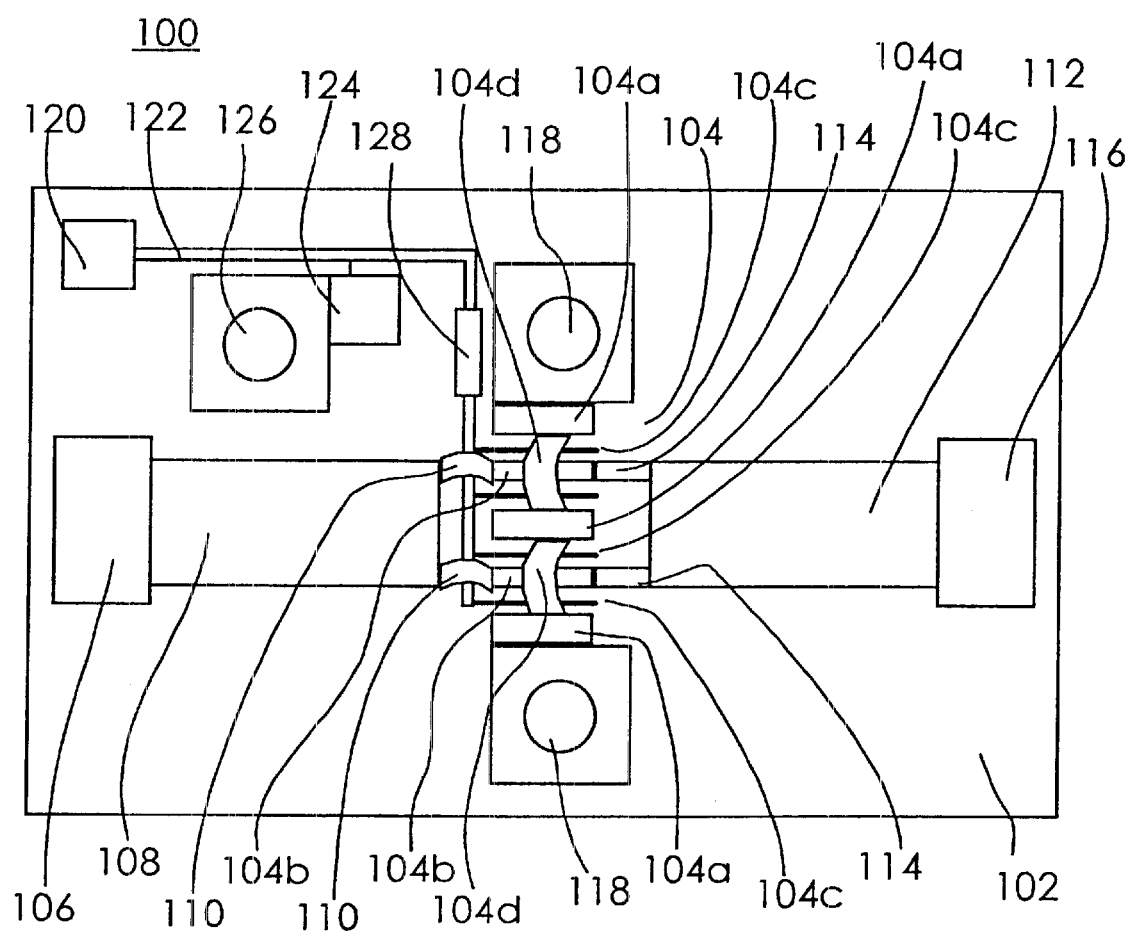
FIG. 15 is a plan view of a conventional switch MMIC chip.
Figure 16:
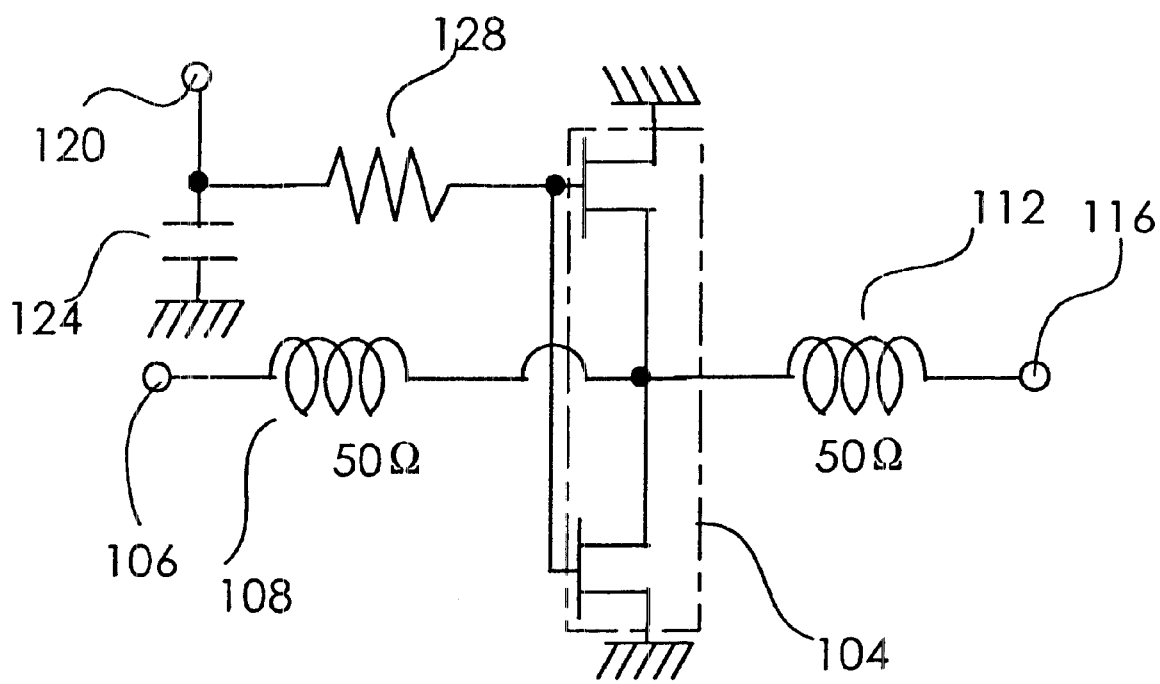
FIG. 16 is a diagram showing an equivalent circuit of a conventional switch MMIC chip.

Furthermore, FIG. 12 is a graph showing the loss and the isolation of a branching switch for a 60-GHz band according to the third embodiment; FIG. 13 is a graph showing the loss and the isolation of a branching switch for a 77-GHz band according to the third embodiment; and FIG. 14 is a graph showing the loss and the isolation of a branching switch for a 90-GHz band according to the third embodiment. Reference numerals Y1 and Y2 indicate loss and isolation curves, respectively, in each figure.

FIG. 12 is prepared with La=2.35 mm and Lm=0.29 mm; FIG. 13 with La=1.75 mm and Lm=0.17 mm; and FIG. 14 with La=1.40 mm and Lm=0.10 mm.

The SP3T switch 60 of the third embodiment can enhance the isolation.

Furthermore, by appropriately selecting the connection positions La and Lm of a pair of FET chips 14, it is possible to easily change a frequency band to be used. Therefore, an SP3T switch having a wide frequency band can be produced using the same high-frequency circuit board 12 and the same FET chips 14 as those as that of the second embodiment.

Even though the third embodiment uses an SP3T switch as its application example, the concept of the third embodiment can be applied to a high-frequency switch of the first embodiment with the same effect.

The present invention provides high-frequency circuit boards and semiconductor devices having configurations as described above. The features and the advantages of the present invention may be summarized as follows.

According to one aspect, a high-frequency circuit board according to the present invention comprises a dielectric substrate, and a high-frequency signal line, another signal line and a first grounding conductor respectively disposed on the main surface along the high-frequency signal line. Since the another signal line and the first grounding conductor are disposed along the high-frequency signal line, the mounting position of the semiconductor chip can be moved along the high-frequency signal line so as to adjust the inductance from the signal input end. As a result, it is possible to configure an inexpensive high-frequency circuit board having a high utilization efficiency.

In another aspect, the high-frequency circuit board is configured such that the high-frequency signal line has a plurality of branch portions along which the first grounding conductor and the another signal line are disposed. Thus, the inductance of each branch portion can be adjusted. As a result, it is possible to configure an inexpensive high-frequency branch circuit board having a high utilization efficiency.

In still another aspect, the high-frequency circuit board further comprises a second grounding conductor disposed along the high-frequency signal line on the other side of the high-frequency signal line. Thus, grounding can be provided on both sides of the high-frequency line, making it possible to reduce the parasitic inductance. As a result, it is possible to configure a high-frequency circuit board having good high-frequency characteristics.

According to another aspect, a semiconductor device according to the present invention comprises a high-frequency circuit board as described above. Further, a semiconductor chip is disposed on the high-frequency circuit board, wherein the control electrode of the semiconductor chip is connected to the another signal line through one of the plurality of bumps, the first electrode is connected to the first grounding conductor through one of the plurality of bumps, and the second electrode is connected to the high-frequency signal line through one of the plurality of bumps. Thus, the semiconductor chip can be moved along the high-frequency signal line so as to adjust the inductance, which makes it possible to offset the variation in the off-capacitance of the semiconductor chip to adjust the frequency characteristics. As a result, it is possible to produce semiconductor devices of identical frequency characteristics at a high yield, providing an inexpensive and highly reliable semiconductor device.

In another aspect, the semiconductor device further comprises another semiconductor chip disposed on the high-frequency circuit board, and the first semiconductor chip and the second semiconductor chip are disposed adjacent each other and a predetermined distance apart. This arrangement can enhance the isolation. Therefore, it is possible to configure a semiconductor device having good frequency characteristics. Furthermore, a semiconductor device having good frequency characteristics over a wide range of frequencies can be configured using the same high-frequency circuit boards and the same semiconductor chips, making it possible to adopt standardized components and therefore provide an inexpensive semiconductor device.

In still another aspect, the semiconductor device is configured such that the high-frequency signal line of the high-frequency circuit board has a plurality of branch portions along which the first grounding conductor and the another signal line are disposed, the plurality of branch portions having a semiconductor chip disposed thereon. Thus, it is possible to configure a semiconductor device with branches having good frequency characteristics. As a result, semiconductor devices with branches having identical frequency characteristics can be produced at a high yield, providing an inexpensive and highly reliable semiconductor device.

In yet another aspect, the semiconductor device comprises a first grounding conductor and a second grounding conductor on the high-frequency circuit board. The first grounding conductor is disposed on one side of the high-frequency signal line with the another signal line disposed between the first grounding conductor and the high-frequency signal line; and the second grounding conductor is disposed along the high-frequency signal line on the other side of the high-frequency signal line. Further, a plurality of first electrodes of a semiconductor chip are disposed with a control electrode and a second electrode disposed therebetween, and each of the first electrodes is connected to the first grounding conductor or the second conductor through one or more of the plurality of bumps. Thus, the first electrodes can be grounded on both sides of the semiconductor chip, making it possible to reduce the parasitic inductance and therefore enhance the high-frequency characteristics. As a result, it is possible to provide an inexpensive and highly reliable semiconductor device having good high-frequency characteristics.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-048233, filed on Feb. 23, 2001 including specification, claims, drawings and summary, on which the Convention priority of the present application is based, are incorporated herein by reference in its entirety.

Just for a general reference as a background art, Japanese Laid-Open Patent Publication No. 2000-165101 discloses a technique that uses flip-chip bonding to dispose an FET formed on a GaAs substrate and a high-frequency switch chip connected to the FET onto an alumina substrate having a connection conductor formed on its surface.

Furthermore, Japanese Laid-Open Patent Publication No. 11-225019 (1999) discloses an oscillation circuit that is fabricated using a dielectric resonator magnetically coupled with a microstrip line formed on the front surface of a dielectric substrate. The resonator is disposed on the back surface of the dielectric substrate at a predetermined position corresponding to the microstrip line on the front surface. In addition, the position of a varactor diode connected to one end of the microstrip line is adjusted so that the varactor diode is disposed at a predetermined position.

What is claimed is:

1. A high-frequency circuit board comprising:
a dielectric substrate;
a high-frequency signal line on a main surface of said dielectric substrate and having an input end and an output end for high-frequency signals, wherein said high-frequency signal line has a plurality of branch portions along which said first grounding conductor and said signal line are disposed;
a signal line disposed on said main surface along said high-frequency signal line; and
a first grounding conductor disposed on said main surface along said high-frequency signal line.

2. The high-frequency circuit board according to claim 1, further comprising a second grounding conductor, wherein said first grounding conductor is disposed on a first side of said high-frequency signal line with said signal line between said first grounding conductor and said high-frequency signal line, and said second grounding conductor is disposed along said high-frequency signal line on a second side of said high-frequency signal line.

3. A semiconductor device comprising:
a high-frequency circuit board including
a dielectric substrate,
a high-frequency signal line on a main surf ace of said dielectric substrate and having an input end and an output end for high-frequency signals,
a signal line disposed on said main surface along said high-frequency signal line, and
a first grounding conductor disposed on said main surface along said high-frequency signal line;
a plurality of bumps disposed on said high-frequency signal line, said signal line, and said first grounding conductor of said high-frequency circuit board; and
a semiconductor chip disposed on said high-frequency circuit board, said semiconductor chip including
a semiconductor substrate, and
a transistor disposed on said semiconductor substrate and having a control electrode, a first electrode, and a second electrode, wherein said control electrode is connected to said signal line through one of said plurality of bumps, said first electrode is connected to said first grounding conductor through one of said plurality of bumps, and said second electrode is connected to said high-frequency signal line through one of said plurality of bumps.

4. The semiconductor device according to claim 3, further comprising:
a second plurality of bumps disposed on said high-frequency signal line, said signal line, and said first grounding conductor of said high-frequency circuit board; and
a second semiconductor chip disposed on said high-frequency circuit board, said second semiconductor chip including
a second semiconductor substrate, and
a transistor disposed on said second semiconductor substrate and having a control electrode, a first electrode, and a second electrode, wherein said control electrode is connected to said signal line through one of said second plurality of bumps; said first electrode is connected to said first grounding conductor through one of said second plurality of bumps; and said second electrode is connected to said high-frequency signal line through one of said second plurality of bumps, said first semiconductor chip and said second semiconductor chip being disposed adjacent and spaced apart from each other.

5. The semiconductor device according to claim 3, wherein said high-frequency signal line of said high-frequency circuit board has a plurality of branch portions along which said first grounding conductor and said signal line are disposed, said plurality of branch portions having said semiconductor chip disposed thereon.

6. The semiconductor device according to claim 3, further comprising:

a second grounding conductor; and a plurality of bumps disposed on said second grounding conductor wherein said first grounding conductor of said high-frequency circuit board is disposed on a first side of said high-frequency signal line with said another signal line between said first grounding conductor and said high-frequency signal line;

said second grounding conductor is disposed along said high-frequency signal line on a second side of said high-frequency signal line; and a plurality of first electrodes of said semiconductor chip are disposed with a control electrode and a second electrode in between each pair of first electrodes, each of said first electrodes being connected to said first grounding conductor or said second grounding conductor through at least one of said plurality of bumps disposed on said first grounding conductor or at least one of said plurality of bumps disposed on said second grounding conductor.

* * * * *